United States Patent [19]

Sone et al.

[11] Patent Number: 5,691,003
[45] Date of Patent: Nov. 25, 1997

[54] PLATING METHOD BY MEANS OF AN ELECTROLESS GOLD PLATING SOLUTION AND SYSTEM THEREFOR

[75] Inventors: Takayuki Sone; Hiroshi Wachi, both of Kanagawa-ken, Japan

[73] Assignee: Electroplating Engineers of Japan Limited, Tokyo, Japan

[21] Appl. No.: 546,722

[22] Filed: Oct. 23, 1995

[30] Foreign Application Priority Data

Oct. 26, 1994 [JP] Japan .................. 6-262893
Dec. 12, 1994 [JP] Japan .................. 6-307381

[51] Int. Cl.⁶ .................................. B05D 1/18
[52] U.S. Cl. .......................... 427/437; 427/443.1
[58] Field of Search ...................... 427/437, 443.1

[56] References Cited

U.S. PATENT DOCUMENTS

| | | | |
|---|---|---|---|
| 4,152,467 | 5/1979 | Alpaugh et al. | 427/8 |
| 4,388,346 | 6/1983 | Bickler | 427/58 |
| 4,616,596 | 10/1986 | Helber et al. | 118/603 |
| 4,865,888 | 9/1989 | Akaheshi et al. | 427/443.1 |
| 5,198,273 | 3/1993 | Ando et al. | 427/437 |
| 5,284,520 | 2/1994 | Tanaka | 427/443.1 |

FOREIGN PATENT DOCUMENTS 63312983  12/1988  Japan ................. C23C 18/40

OTHER PUBLICATIONS

European Search Report, dated Jan. 29, 1996, EPA Application No. 95307577.7, corresponding to present application (4 pages).

*Primary Examiner*—Benjamin Utech
*Attorney, Agent, or Firm*—Watov & Kipnes, P.C.

[57] ABSTRACT

A plating method by means of an electroless gold solution under air supply in the form of air bubbles from air dispersing bodies placed on the bottom of a plating tan, whereby more uniform plating can be achieved and the life of the plating solution can be prolonged. Air bubbles are uniformly supplied over the entire region in the plating tank which corresponds to a plating region of a substance to be plated and placed in the plating tank, and the air supply is adjusted depending on the liquid temperature of the plating solution.

6 Claims, 3 Drawing Sheets

PLATING METHOD BY MEANS OF AN ELECTROLESS GOLD PLATING SOLUTION AND SYSTEM THEREFOR

BACKGROUND OF THE INVENTION (1) Field of the Invention

The present invention relates to a plating method, and more particularly, to a plating method by means of an electroless gold plating solution.

(2) Description of the Prior Art

For gold plating using an electroless gold plating solution, gold is generally deposited via a reducing agent contained in a plating solution. Gold plating by means of such an electroless gold plating solution has been widely applied, for example, to precision electroless parts, but the plating regions of substances to be plated tend to be more complex and finer recently, and accordingly the use of an electroless gold plating solution with a higher reduction force has been required. Such increase of the reduction force is inevitable for the application to substances to be plated which have more complex and finer plating regions. However, new drawbacks involved in the increase of the reduction force have also occurred.

If the reduction force is elevated, the reduction force will be high above a required level to readily plate portions other than the regions to be intended for plating. For preventing this, air in a state of air bubble is supplied into the plating solution to increase dissolved oxygen whereby the reaction of a reducing agent should be controlled. Some disadvantages have been induced from the air supply. More particularly, the deposit thickness of gold is readily varied and the life of the plating solution is shortened because the quantity of decomposed products of the reducing agent is increased.

It has been found during the course of the investigation of the cause that the method of supplying air is problematic. In a conventional manner as shown in FIG. 4, air is supplied in the state of air bubble, from air dispersing tubes 21, 21 placed at the two corners on the bottom of a plating tank 20 into a plating solution L in the plating tank 20. Therefore, the dispersion of air bubble into the plating tank is not sufficiently uniform, involving the variation in the effect of agitating the plating solution, which leads to one of the causes of the variation in the deposit thickness.

From the respect of such findings, it has become apparent as a significant requirement that the supply of air bubble should be as uniform as possible throughout the whole plating tank or at least over the entirety of a region corresponding to a plating region of a substance to be plated.

It has been also indicated that the decomposed products of a reducing agent are readily generated as dissolved oxygen increases in quantity and that dissolved oxygen level should be suppressed within the lowest range required for controlling the reduction force of the reducing agent.

Furthermore, not only the decomposition of a reducing agent but also gold deposition may serve as an element affecting the life of a plating solution, and it has been found that once fine gold particles are generated, gold deposition readily increase in quantity by using the particles as the nucleus, and that therefore, the removal of the gold particles generated via gold deposition at an appropriate cycle should be effective for the suppression of the increase of gold deposition, namely for the prolonged life of the plating solution.

SUMMARY OF THE INVENTION

Based on the aforementioned findings, the present invention is fundamentally a plating method by means of an electroless gold solution under air supply in the form of air bubbles from air dispersing bodies having a great number of air holes and being placed on the bottom of a plating tank, wherein air bubbles are uniformly supplied over the entire region in the plating tank which corresponds to a plating region of a substance to be plated and is placed in the plating tank, so as to supply air bubbles uniformly into the plating solution around the substance to be plated, in particular. Consequently, the irregularities of air mixing in the plating solution can be eliminated, leading to more uniform plating.

In addition to the aforementioned fundamental structure to eliminate the irregularities of air mixing in accordance with the present invention, the air supply should be adjusted depending on the temperature of the plating solution, so as to suppress the decomposition of a reducing agent as much as possible by decreasing the level of air supply down to the lower limit required to control the reducing force of the reducing agent. In other words, air supply should be increased in the state where the temperature of the plating solution is so high that the reductive reaction readily occurs, whereas air supply should be decreased in the state where the temperature of the plating solution is so low that the reductive reaction scarcely occurs, namely in the state where less dissolved oxygen is required, whereby air supply should be close to the lower limit required for controlling the reduction force of the reducing agent, to suppress the decomposition of the agent as much as possible.

More particularly, on the basis of the face of ascending air bubbles, namely the area of the dispersion face of ascending air bubbles from the bottom of the plating tank, air supply is defined as 0.5 to 5 liters per minute per 100 $cm^2$ and 0.05 to 0.5 liter per minute per 100 $cm^2$, when the temperature of the plating solution is the temperature in the state of plating (generally 50° to 70° C.) and when the temperature of the plating solution is the temperature in the state under storage (generally 10° to 30° C.), respectively. Such relatively wide range of air supply level is due to the difference in the level of required dissolved oxygen, depending on the form and size of a plating region of a substance to be plates. The more complicated and fine the plating region is, the more dissolved oxygen is required in general.

A plating system for the plating method as described above in accordance with the present invention has air dispersing bodies each having a great number of air holes on the bottom of a plating tank, and is formed such that plating is carried out with an electroless gold plating solution under air supply in the form of air bubble from the air dispersing bodies and such that air bubbles are supplied in a uniform manner over the entirety of a region in the plating tank which region corresponds to a plating region of a substance which is to be plated and is placed in the plating tank, and besides is provided with a flow adjusting means to adjust the air supply into the air dispersing bodies as well as a liquid temperature detecting means to detect the temperature of a plating solution so that the flow adjusting means will work in connection with the temperature detected by the liquid temperature detecting means, whereby being formed such that the air supply into the plating solution is adjusted depending the temperature of the plating solution.

The air dispersing bodies to be used in the plating method and the plating system in accordance with the present invention are preferably made of porous materials, and when such porous materials are used, an infinite number of air holes of a hole size of 100μ or less may be readily in preparation at an extremely short interval. The air dispersing bodies using such porous materials may preferably be of structure formed by preparing porous materials in a tubular form of an appropriate size and than arranging the materials in a horizontal direction or of a box-like structure with the air dispersing face made of the porous materials. As to the lower limit of the hole size of the air holes, herein, the smaller the hole size is, the more preferable it is because of the reasons described above. Therefore, in general, the hole size of a porous material as described above is possibly in a range of about 1μ, with no specific reason for the limitation.

In order to further decrease air supply for making the duration of contact of the plating solution with air as short as possible, in addition to the individual methods in accordance with the present invention, the plating solution is rapidly cooled down to a predetermined temperature to make as short as possible the period of the state where the liquid temperature is so high that air supply should be increased, when after the use, the plating solution is stored as it is in a plating tank until next plating operation.

In the present invention, the plating solution is rapidly cooled in a plating tank enclosed by an outer circumference tank in which a low-temperature solution continuously flows for rapid cooling, while the solution is heated in the plating tank enclosed by the outer circumference tank in which a heat-source solution is stored and heated for heating the solution. In such a manner, the transfer from the heated state to the cooled state is rapidly attained, advantageously for the intention to shorten the period of the state at a high temperature as much as possible as described above and also for the simplification of the system structure.

In addition to the individual methods in accordance with the present invention, the plating solution in the plating tank is filtered to remove gold particles via gold deposition when a predetermined amount of gold is deposited in the plating tank. The plating system to carry out such a plating method in accordance with the present invention should be of a structure wherein there is arranged in addition and the individual structural components, a filter unit composed of a filter device connected to the bottom of the plating tank, a storage tank for storing the plating solution filtered with the filter device, and a suction part placed between the filter device and the storage tank to such up the plating solution flowing from the plating tank into the filter device, whereby the gold particles via gold deposition can be removed by filtering the plating solution in the plating tank when a predetermined amount of gold is deposited in the plating tank.

Filtering can be carried out by the filter unit, with no use of a circulation pump which readily generates gold deposition to shorten the life of the plating solution or which will require troublesome post-treatment works. Therefore, filtering can be carried out more effectively so as to prolong the life of the plating solution.

It should be noted that the content of the invention is not limited to the above description, and the objects, advantages, features, and usages will become more apparent according to descriptions below. It is also to be understood that any appropriate changes without departing from the spirit of the invention are in the scope of the invention.

DETAILED DESCRIPTION OF THE PREFERRED EMBODIMENTS

Figure 1:
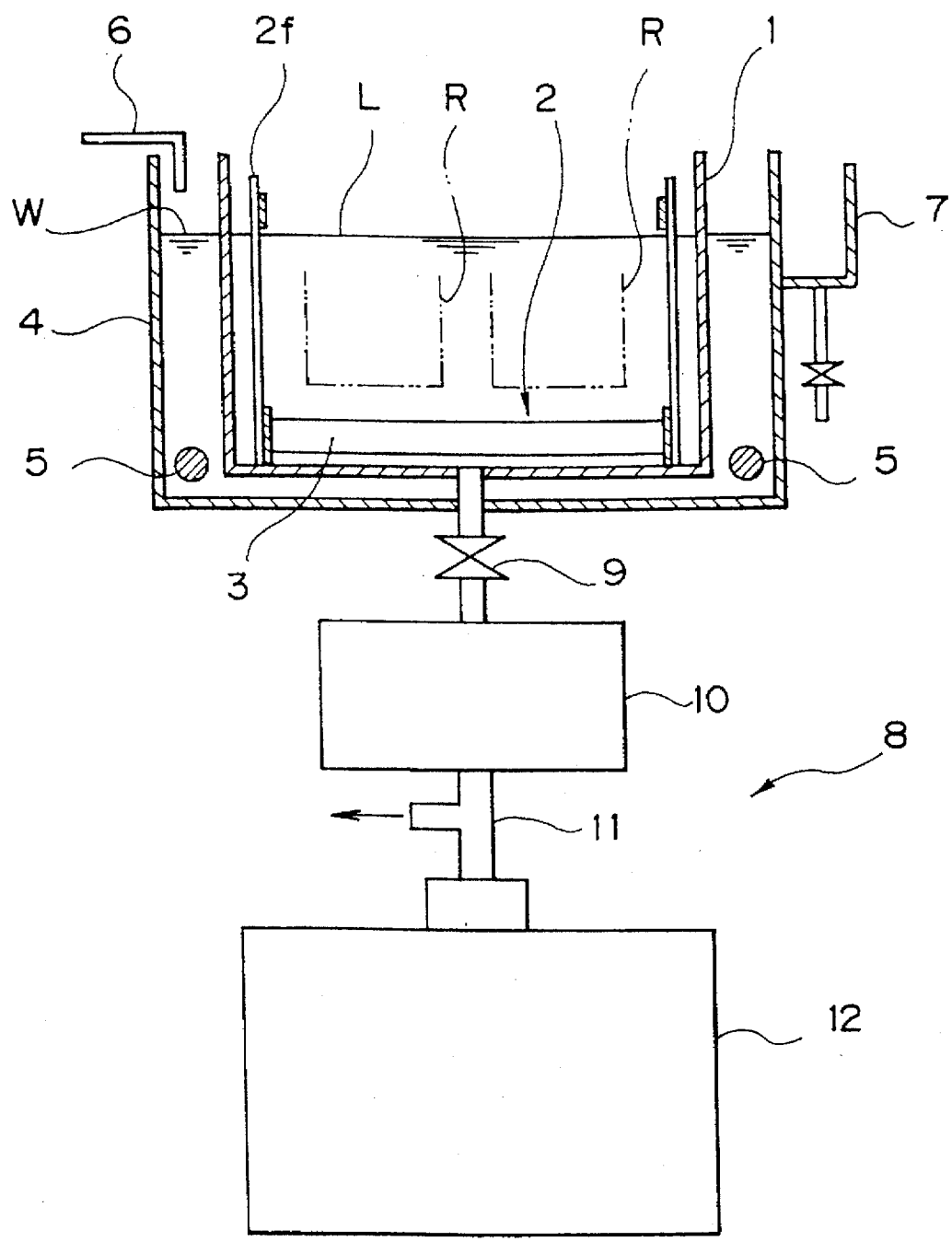
FIG. 1 is a cross sectional view of a plating system in accordance with the present invention.

One example of the present invention will now be explained below. Firstly, a plating system will be described. As shown in FIG. 1, the plating system of the present invention has a plating tank 1 formed in a box-like form with an open top, on the bottom of which are arranged air dispersing bodies 2, wherein compressed air fed from a compressed air supply source (not shown in the figure) is fed in the state of air bubble through the air dispersing bodies 2 into a plating solution L in a plating tank 1. Not individually shown in the figure, a flow adjusting means is arranged in a circuit for feeding compressed air into the air dispersing bodies 2, and the supply of compressed air to the air dispersing bodies 2 is to be adjusted automatically depending on the liquid temperature of the plating solution L by the sequential operation of a liquid temperature detecting means detecting the liquid temperature of the plating solution L with the flow adjusting means.

Figure 2:
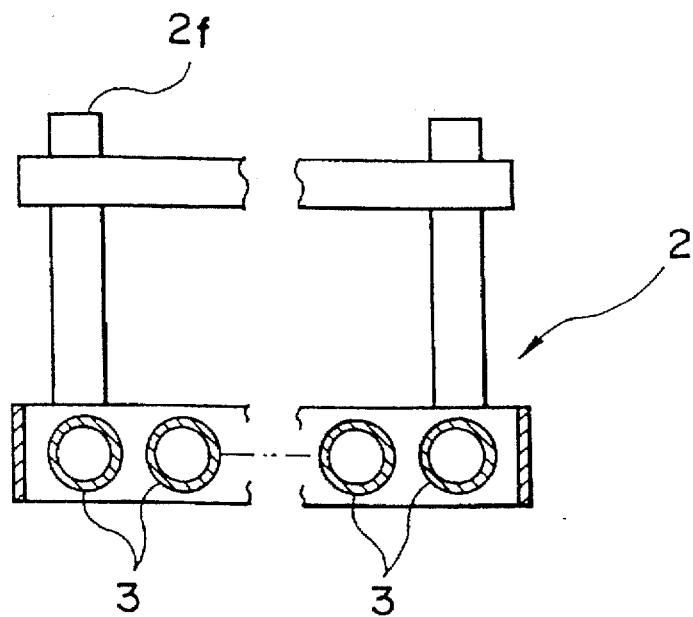
FIG. 2 is a cross sectional view of air dispersing bodies of the plating system of FIG. 1.

The air dispersing bodies 2 are formed by fixing air dispersing tubes 3 to frames 2f and then arranging a plurality of the tubes in a horizontal direction (FIG. 2). Each of the air dispersing tubes 3 has a size of around 3 cm in diameter, and is arranged at a very short interval of several mm, whereby air bubbles released from the outer circumference of each of the air dispersing tubes 3 ascend in uniform dispersion throughout the plating solution L from the bottom of the plating tank 1.

The plating tank 1 is also enclosed by an outer circumference tank 4 formed in a box-like form with the top open. The outer circumference tank 4 is for heating the plating solution in the plating tank 1 indirectly or for cooling the solution indirectly, and stores water W as a heat source liquid, which is heated with heater 5 for heating the plating solution L in the plating tank 1 or which is overflown from overflow part 7 on the opposite side of water inlet tube 6 while water is continuously fed from the tube 6 during cooling, whereby the plating solution L in the plating tank 1 is rapidly cooled.

Furthermore, filter unit 8 is connected to the plating tank 1. The filter unit 8 is composed of a filter device 10 connected through a valve 9 to the bottom of the plating tank 1, and a storage tank 12 connected through a suction part 11 to the filter device 10, and when the suction part 11 is sucked with a suction means, not shown, to put the part under a negative pressure while the valve 9 is in open state, the plating solution L is sucked from the plating tank 1 into the filter device 10 via the suction force corresponding to the pressure, where gold particles from gold deposition are filtered off to store the resulting solution in the storage tank 12. The plating solution stored in the storage tank 12 is fed back directly from the storage tank 12 taken off from the filter unit 8 into the plating tank 1 for recycling, excluding the case that the life of the solution is over.

Plating process using the plating system was done under the following conditions. A plurality of electronic part, substances to be plated, were fixed in each of a pair of two racks R, R as shown in FIG. 1. which were then immersed in the plating solution L. While the liquid temperature around 70° C. during plating operation is kept, air supply in such state was maintained at 2 liters/minute/100 cm². While intermediately interrupting the plating procedure and inserting a single process for cooling the plating solution down to room temperature to put the solution in the state under storage and a single process for adjusting the air supply to 0.2 liter/minute/100 cm², plating process was carried out until the plating solution was impossible to use. The filtration of gold particles by means of the filter unit 8 was carried out every 1 turn. Herein, the term "turn" means the cycle required for depositing gold of a weight corresponding to the weight of gold initially contained in the plating solution onto a substance to be plated, and 4 g is designated 1 turn in this example. Table 1 shows the results in comparison with those from a conventional method. The term "liquid life" in Table 1 means the retaining period for effective plating.

TABLE 1

| Evaluated items | | Present invention | Prior art | Evaluation |
| --- | --- | --- | --- | --- |
| Variation in deposit thickness on 1 rack | Average | 1.8µ | 2.5µ | Standard deviation is decrease by ¼ fold, indicating remarkably increased plating uniformity. |
| | Maximum | 2.0µ | 3.5µ | |
| | Minimum | 1.5µ | 1.5µ | |
| | Standard deviation (range of variation) | 0.5µ | 2.0µ | |
| Specific gravity of a plating solution after 2 turns (index of decomposition of a reducing agent) | | 10° Be' | 18° Be' | The increase in specific gravity is lowered by 45%, indicating almost half a reduction of decomposition of a reducing agent. |
| Generation of gold particles after 2 turns | | 0.1 g/l | 0.5 g/l | Generation of gold particles is less by ⅕ times. |
| Liquid life | | 3 turns | 0.5 turn | Liquid life is prolonged by 6 times. |

Figure 3:
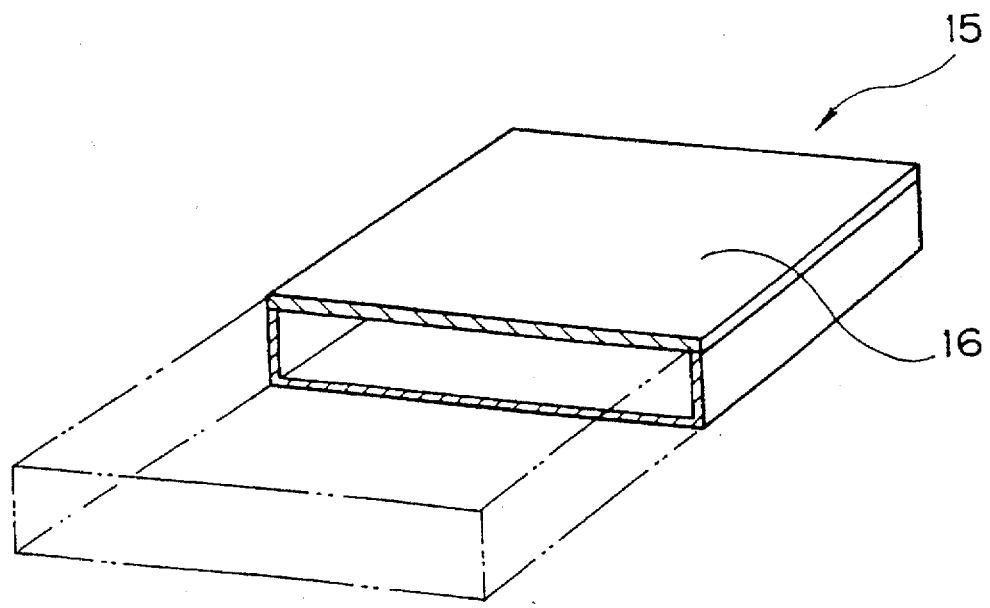
FIG. 3 is a perspective view encompassing the cross section of air dispersing bodies of another example.
Figure 4:
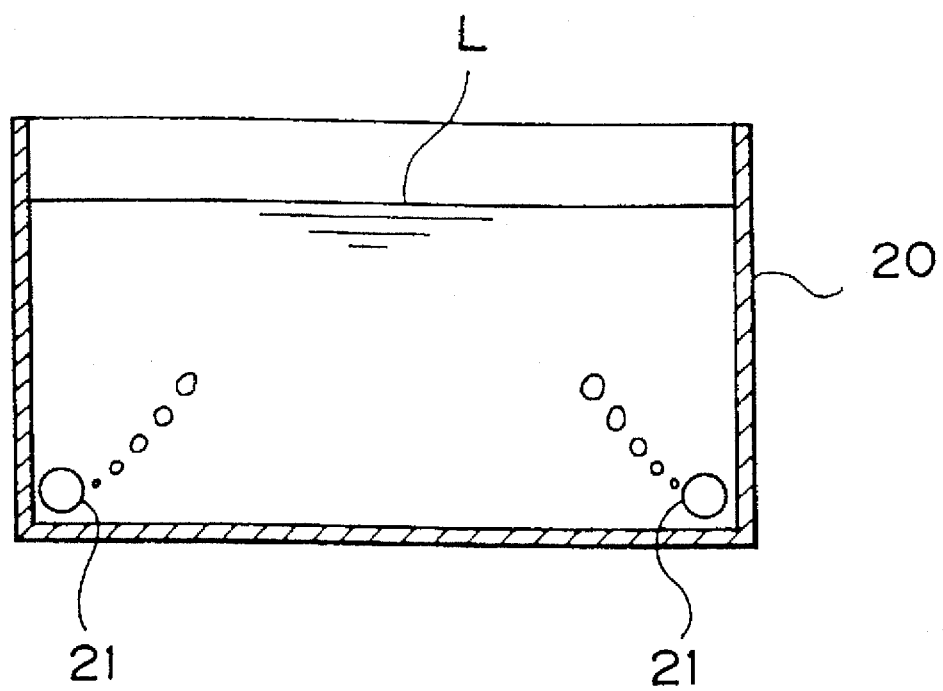
FIG. 4 is a cross sectional view representing a schematic structure of a conventional plating system.

FIG. 3 shows air dispersing bodies 15 in another example, which are structurally formed wholly in a box-like form with a dimension corresponding to the size of a plating tank and whose upper top is formed of a porous plastic plate 16 to prepare the top as an air dispersing face.

In accordance with the present invention as described above, gold plating by means of an electroless gold plating solution can be done more uniformly, and additionally, the life of the plating solution can be prolonged, whereby high-quality plating process onto electronic parts increasingly requiring highly precise plating can be achieved at a higher efficiency.

What is claimed is:

1. A plating method by means of an electroless gold plating solution, comprising the steps of:

filling a first tank with said electroless gold plating solution for gold plating parts positioned in said first tank;

injecting air over a wide enough area at the bottom of said first tank for forming air bubbles that rise uniformly into the region of said first tank where said parts are positioned for gold plating, for surrounding said parts with air bubbles;

maintaining a plating temperature substantially higher than the storage temperature of said electroless gold plating solution for periods of time between plating operations; and adjusting the flow rate of injected air at a given plating temperature, while maintaining substantially uniform plating, whereby said adjusting step includes the step of reducing the flow rate of injected air to a substantially lower flow rate relative to that used at plating temperatures, at times that the temperature of said electroless gold plating solution is at the lower storage temperature, whereby the ratio of the flow rate of air used at plating temperatures to the flow rate of air used at storage temperatures is ten to one.

2. The plating method of claim 1, wherein the plating temperature ranges from 50° C. to 70° C., and the storage temperature ranges from 10° C. to 30° C., whereby the difference in temperature between the plating and storage temperatures is about 40° C. over their respective temperature ranges.

3. The plating method of claim 2, wherein during plating of parts the flow rate of injected air ranges from 0.5 to 5.0 liters per minute per 100 cm$^2$ dispersion face of ascending air bubbles over the plating temperature range, respectively, and between plating operations the flow rate of injected air ranges from 0.05 to 0.5 liter per minute per 100 cm$^2$ dispersion face over the storage temperature range.

4. The plating method of claim 1, further including the set of:

rapidly cooling said electroless gold plating solution from the plating temperature to an ambient storage temperature.

5. The plating method of claim 1, further including the steps of:

placing said first tank into a larger second tank that at least contains the sides and bottom of said first tank;

circulating a heating solution through said second tank for heating and retaining said electroless gold plating solution in said first tank at a desired plating temperature; and circulating through said second tank after a plating operation, a liquid having a substantially lower temperature relative to the plating temperature, for rapidly cooling said electroless gold solution down to said storage temperature.

6. The plating method of claim 1, further including the step of:

removing gold particles caused by gold deposition by filtration.

* * * * *

UNITED STATES PATENT AND TRADEMARK OFFICE
CERTIFICATE OF CORRECTION

PATENT NO. : 5,691,003
DATED : November 25, 1997
INVENTOR(S) : Takayuki Sone and Hiroshi Wachi It is certified that error appears in the above-indentified patent and that said Letters Patent is hereby corrected as shown below:

Col. 6,
Claim 4, line 1, change "set" to --step--.

Signed and Sealed this

Twenty-fourth Day of March, 1998

Attest:

BRUCE LEHMAN

Attesting Officer

Commissioner of Patents and Trademarks